United States Patent [19]
Visee

[11] Patent Number: 5,983,288
[45] Date of Patent: Nov. 9, 1999

[54] DYNAMICALLY CONFIGURABLE PERSONAL COMPUTER CARD UTILIZING VARIABLE INTERROGATION SIGNAL TO DETECT CONNECTED EXTENSION

[75] Inventor: Maarten Visee, Houten, Netherlands

[73] Assignee: Lucent Technologies Inc., Murray Hill, N.J.

[21] Appl. No.: 08/699,747

[22] Filed: Aug. 20, 1996

[51] Int. Cl.⁶ .................................................... G06F 13/110
[52] U.S. Cl. .............................................. 710/16; 710/13
[58] Field of Search .................. 340/568.1; 395/828, 395/829, 830; 235/462.47; 710/15, 16, 8, 10, 13

[56] References Cited

U.S. PATENT DOCUMENTS

| | | | |
|---|---|---|---|
| 4,575,714 | 3/1986 | Rummel | 340/568 |
| 5,159,683 | 10/1992 | Lvovsky et al. | 395/830 |
| 5,767,500 | 6/1998 | Cordes et al. | 255/472 |

OTHER PUBLICATIONS

Kenneth Short "Microprocessors and Programmed Logic", Prentice Hall, Inc, 1981, pp 430–440.

*Primary Examiner*—Dung C. Dinh
*Attorney, Agent, or Firm*—Christopher N. Malvone

[57] ABSTRACT

A system comprising a personal computer card and an interchangeable extension consists of a personal computer card a card information storage (CIS) system and a coaxial connection socket. First logic means are arranged to control an interrogation means comprising a digital-to-analog current converter, comparator and reference voltage source in order to supply a series of DC currents to the socket. The extension has a coaxial connection pin and grounded resistor having a value which identifies the type of extension so that when a DC current is applied to the pin by the socket, a characteristic voltage is generated across the resistor which is compared by the comparator with the reference voltage. The comparator indicates the value of resistor as a digital value to the CIS system which communicates the characteristics of the extension to a host PC. A second logic means disables power upon removal of a previous extension from the socket. Each extension may comprise a radio frequency antenna which may be external to the extension.

4 Claims, 2 Drawing Sheets

DYNAMICALLY CONFIGURABLE PERSONAL COMPUTER CARD UTILIZING VARIABLE INTERROGATION SIGNAL TO DETECT CONNECTED EXTENSION

FIELD OF THE INVENTION

This invention relates to a personal computer card, that is a card which can interact with a host personal computer (PC) through a connection such as a PC bus.

BACKGROUND OF THE INVENTION

Typically, each personal computer card contains a Card Information Storage (CIS) unit which stores information related to the nature of the card, and the information is made available to the host PC which responds appropriately. The information may include the manufacturer of the card, the card type and functionality, and its current consumption.

It is known to supply a plug-in extension to a card to extend its functions; such an extension may for example provide a telephone jack so that the card can operate as an Internet interface. The CIS unit must then indicate to the PC the change in nature of operation of the card, and such information is coded into the CIS unit of the card with which the extension is used. At present each card can be connected only to a single type of extension whose characteristics are coded into the CIS unit of the card.

SUMMARY OF THE INVENTION

It is an object of an embodiment of the invention to provide a personal computer card which is capable of operating with more than one type of extension.

According to an embodiment of the invention, there is provided a personal computer card comprising communication means for communication with a host personal computer; a card information storage (CIS) system; connection means to permit the connection of an extension to the card; detection means to detect the presence of an extension; and interrogation means to supply an interrogation signal to the extension, to identify the characteristics of the extension, and to supply an identification signal to the CIS system.

Preferably the CIS system contains a look-up table recording a plurality of extension identity signals and the corresponding characteristics of the related extension.

Preferably the interrogation means comprises means to supply a series of DC current levels of increasing value to the extension connection means, means to supply a reference voltage, and comparator means to compare the reference voltage and any voltage received by the extension connection means.

Preferably the personal computer card further comprises means to disable the card on connection of an extension and to re-enable the card after an identity signal for the extension has been supplied by the CIS system to a host personal computer.

Also according to an embodiment of the invention, there is provided an extension for a personal computer card having means to connect the extension to a personal computer card, and means to provide an identification signal which identifies the characteristics of the extension.

Preferably the means to provide the identification signal comprises a resistor having a value which identifies the type of extension.

Preferably the personal computer card identifies the extension by applying a current of increasing value to the resistor which is grounded, sensing the voltage which is generated across the resistor, and comparing the sensed voltage with a reference voltage.

Optionally the personal computer card is of the type Personal Computer Memory Card International Association known as a PCMCIA card, suitable for insertion into a PC.

DETAILED DESCRIPTION

Figure 1:
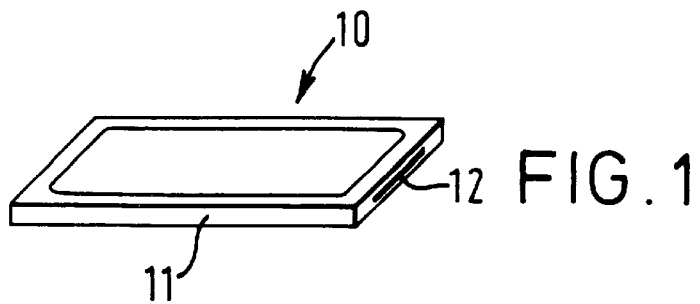
FIG. 1 illustrates a PCMCIA Type-2 card.

In FIG. 1, a PCMCIA Type-2 card 10, which will be referred to as a base card, comprises a thin rectangular card 11 having at one of its short ends a connection slot 12 by which an extension can be connected. The card can also interact with a host PC via a bus (not shown) at the opposite short end.

Figure 2A:
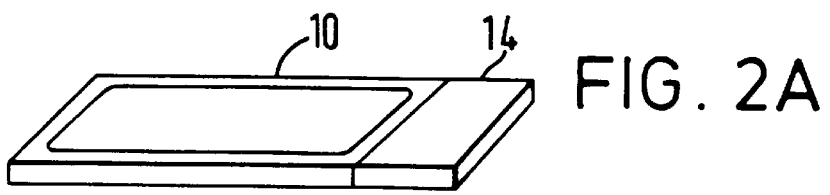
FIGS. 2A to 2D illustrate four types of antenna extensions to a PCMCIA Type-2 card.

In FIG. 2A, the base card 10 is connected to an extension 14, which includes a passive integrated antenna. The card 10 may include a WaveLAN™ Series-2 modem or another wireless modem. WaveLAN™ Series-2 modems are available from AT&T Corp.

Figure 2B:
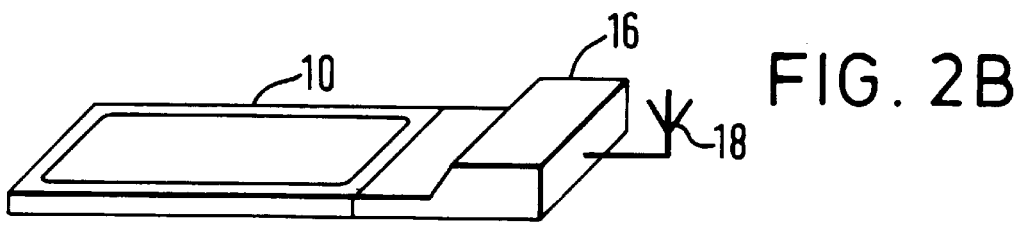

In FIG. 2B, the base card 10 is connected to an extension 16, which comprises a moderate power amplifier and a low noise receiver (not shown). The extension has an external antenna 18.

Figure 2C:
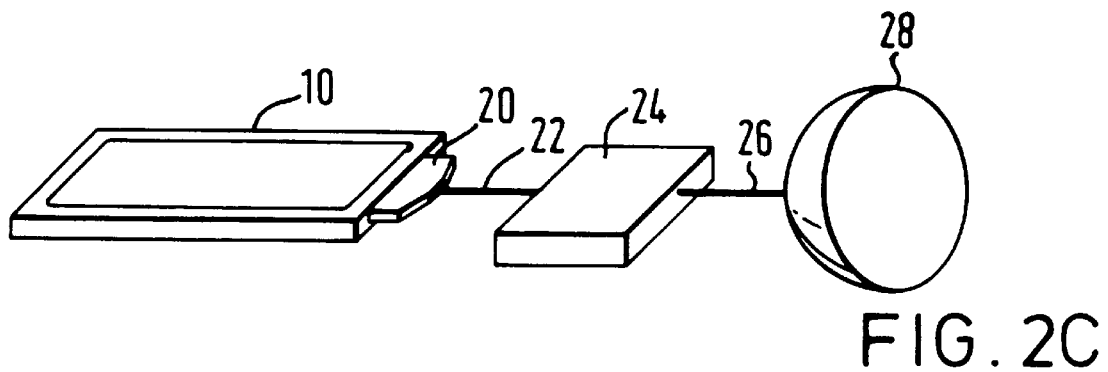

In FIG. 2C, the base card 10 is connected to a 3-part extension, comprising a plug-in part 20 which is connected by a first connector 22 to a second part 24 which contains a high power amplifier (not shown) and a low noise receiver (not shown). The second part 24 is connected by a second connector 26 to a high gain parabolic antenna 28.

Figure 2D:
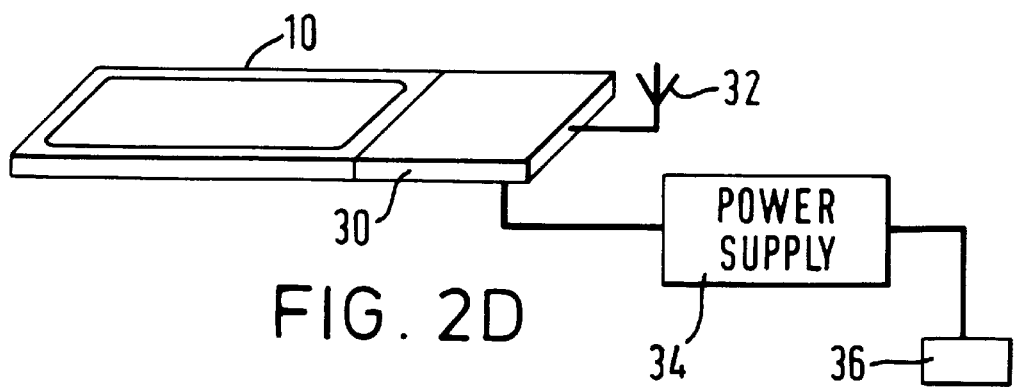

In FIG. 2D, the base card 10 is connected to an extension 30 comprising a moderate power amplifier and a low noise receiver (not shown) connected to an external antenna 32 and also to an external power supply 34 which in turn is connected to an AC power source or to a battery 36.

In FIGS. 2A to 2D, the extensions shown in FIGS. 2A, B and C are supplied with power through the base card 10 from the host PC, which must know the power requirements of each extension, which are clearly different. The power requirement for the amplifiers increases from FIGS. 2A to 2B to 2C to 2D. It should be noted that in FIG. 2D power is provided by the external power supply 34.

Figure 3:
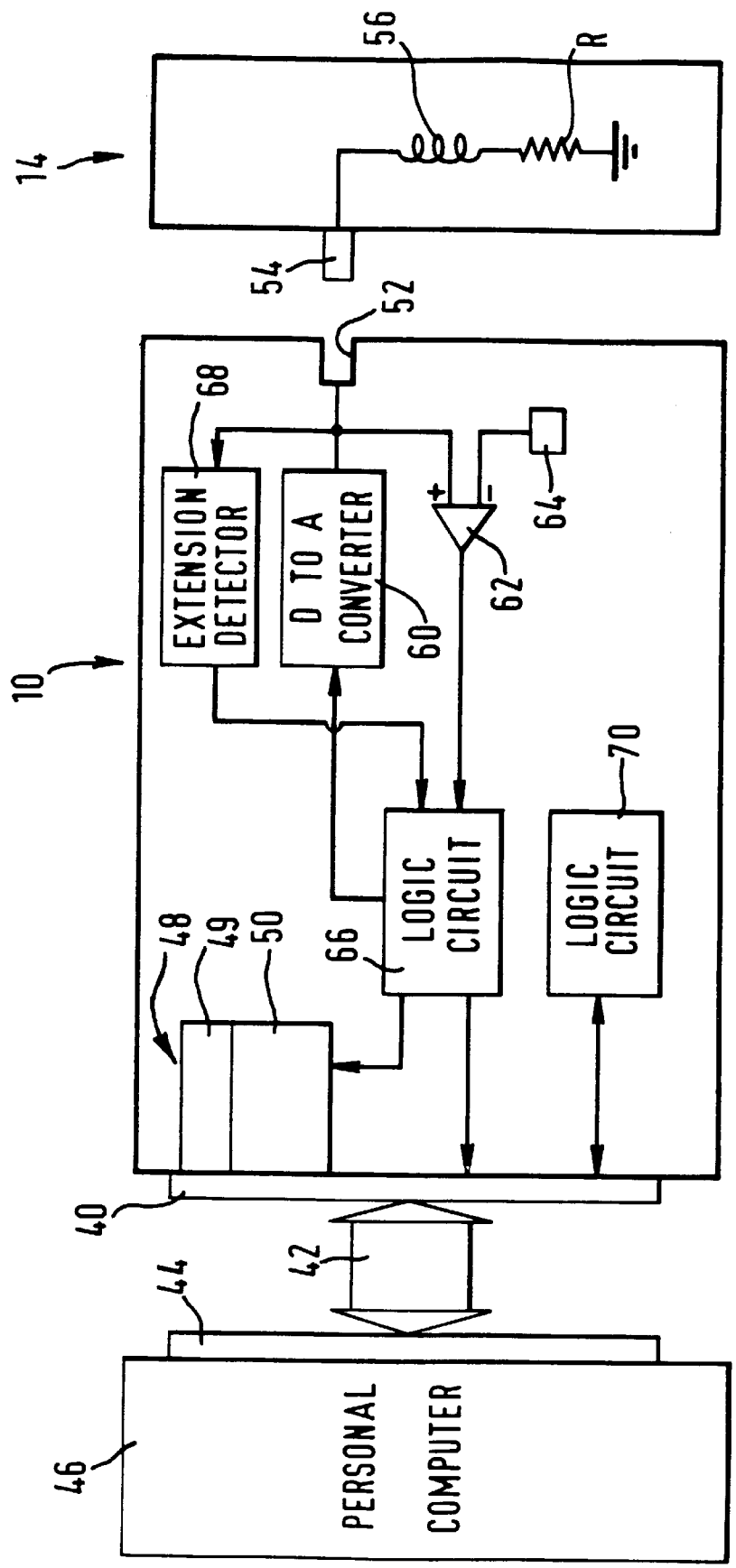
FIG. 3 is a block diagram indicating the inter-operation of a PCMCIA card and an extension.

In FIG. 3, the base card 10 is connectable by a bus 40 through a connector 42 to a PC bus 44 connected to a host computer 46. The card 10 carries a CIS or memory system 48 including a CIS register 49 and an area 50 containing a list of the basic characteristics (such as manufacturer's name and identification number) of all types of extension likely to be connected to the card, in the form of a look-up table, with an identification code for each extension type.

At its end opposite to the bus 40 the card 10 has a coaxial socket 52 into which can be fitted a coaxial connection pin 54 carried by the extensions, such as extension 14. The coaxial socket 52 forms a part of the connection slot 12 (FIG. 1). The pin 54 is connected through an RF choke indicated at 56 to one end of a resistor R, the opposite end of which is grounded. The value of resistor R is selected to be different for each type of extension and provides an identification of the extension type.

The coaxial socket 52 on the base card 10 is connected to a digital-to-analog current converter (DAC) 60 that provides an output current in response to a digital input. Socket 52 is also connected to the positive input of a voltage comparator 62, the negative input of which is connected to a reference voltage source 64. The output of the voltage comparator 62 is connected to a first logic circuit 66 which also receives an output signal from an extension detector circuit 68, and supplies a control signal to the DAC 60. The logic circuit 66 is connected to the CIS system 48, and to the bus 40. Logic circuits 66 and 70 may be implemented using, for example, a microprocessor. The card 10 also carries a second logic circuit 70 connected to the bus 40. It should be understood that the extension detector 68 provides a signal at its output representative of whether or not an extension, such as the extension 14 is coupled to the card 10. The extension detector 68 may take the form of a current sensor which senses the output current of the DAC 60. If no extension is present, this output current is zero or nearly zero. Alternatively, the extension detector 68 could include a voltage comparator which compares the voltage across the resistor R with a reference voltage.

In operation, when an extension is removed from the socket 52, its absence is detected by the detector circuit 68 which provides a signal to the first logic circuit 66 which then sends an interrupt signal via buses 40,44 and connector 42 to the host PC 46 which recognises that the card is no longer available. A signal is then sent by the PC 46 to the second logic circuit 70 to suspend the power supply to the parts of the base card 10 except the CIS system 48, the logic circuits 66,70, and the identification circuit comprising circuits 60, 62 and 64.

When a new extension 14 is plugged into the socket 52, this is detected by the detector circuit 68. The first logic circuit 66 then provides a control signal to the DAC 60 which supplies a low value current to the extension 14; current flowing through the resistor R to ground causes a characteristic voltage to be generated across the resistor R. This voltage is applied through pin 54 and connector 52 to the comparator 62 for comparison with reference voltage $V_{REF}$ from 64. If the received voltage is lower than the reference voltage, the comparator outputs a logic zero, and logic circuit 66 instructs the DAC 60 to increase the current and the comparison is repeated. The current is increased in steps until the received voltages are higher than the reference voltage, when comparator 62 outputs a logic 1, and the logic circuit 66 sends a signal indicating the value of that current supplied to the DAC 60, and therefore the value of resistor R, to the look-up table 50 in the CIS system 48; from the look-up table the identity of the extension is determined.

The logic circuit 66 now sends a second interrupt signal to the host PC 46 and also the information relating to the requirements of the new extension; the PC software driver accesses a look-up tables (not shown) containing full power supply requirements and other information regarding all possible extensions. The PC 46 thus determines whether it can handle the card and extension (eg whether it can supply sufficient current), and the PC either sends a signal to disable the card entirely and warn the user, or allows the PC to supply the card and extension with the appropriate power requirements.

Since the extensions illustrated in FIGS. 2A to 2D operate on radio frequency signals, the connection between the card 10 and extension 14 includes a coaxial link, and the RF choke 56 isolates the resistor R. There may be other types of extension which do not need a coaxial connection. For example, it would not be necessary for a modem allowing an Internet connection to have a coaxial connection to the base card.

If however a coaxial connection is used, the ground connection for resistor R can be provided through the cable shield. If there is no coaxial connection, a separate grounding pin (not shown) can be provided on the extension 14 for connection to an appropriate ground socket (not shown) on the card 10.

This embodiment of the invention therefore allows a single base card to be used with a variety of different extensions having different power requirements and other characteristics. As each extension is plugged in, the host PC is automatically updated after the extension is identified. For a small number of types of extension, a simple register architecture can be used in the base card; the digital form of the identity (ID) of the extension is written into the CIS register 49, for example bit 0: ID number LSB
bit 1: ID number
bit 2: ID number
bit 3: ID number
bit 4: ID number
bit 5: ID number
bit 6: ID number MSB
bit 7: Low: default Base Card with default Extension (if applicable).
High: non default Extension detected

I claim:

1. A computer card that identifies an extension connected to the computer card, the computer card, comprising:

connection means for connecting the extension to the computer card;

storage means for storing extension identification information;

interrogation means for providing a variable interrogation signal to the extension to produce a signal;

comparator means for determining when the signal crosses a reference voltage in response to the variable interrogation signal;

logic means for identifying an amplitude of the variable interrogation signal that results in the signal crossing the reference voltage, the amplitude of the variable interrogation signal being used to locate extension identification information in the storage means; and communication means for communicating the located extension identification information to the personal computer.

2. The computer card of claim 1, wherein the interrogation means comprises means for providing a digitally controlled current to the extension and means to compare the signal to a reference voltage.

3. A method for providing the identify of a computer card extension to a computer, the computer card extension being connected to a computer card which is connected to the computer, comprising the steps of:

providing a variable interrogation signal from the computer card to the extension card to produce a signal;

determining an identifying amplitude by varying an amplitude of the variable interrogation signal until the signal crosses a reference voltage;

using the identifying amplitude of the variable interrogation signal to locate stored extension card identification information; and providing the located stored extension card identification information to the computer.

4. The method of claim 3, wherein the step of providing an interrogation signal comprises providing an adjustable DC current to the extension card.

* * * * *